US011422187B1

(12) United States Patent
Makkar

(10) Patent No.: US 11,422,187 B1
(45) Date of Patent: Aug. 23, 2022

(54) DATA RETENTION DURING STRUCTURAL TESTING OF SYSTEM-ON-CHTPS

(71) Applicant: NXP B.V., Eindhoven (NL)

(72) Inventor: Shikhar Makkar, Palwal (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/302,727

(22) Filed: May 11, 2021

(51) Int. Cl.
  *G01R 31/3177* (2006.01)
  *G01R 31/3185* (2006.01)
  *G06F 1/08* (2006.01)
  *G01R 31/3181* (2006.01)
  *G01R 31/317* (2006.01)

(52) U.S. Cl.
  CPC ..... *G01R 31/3177* (2013.01); *G01R 31/3181* (2013.01); *G01R 31/31704* (2013.01); *G01R 31/318536* (2013.01); *G01R 31/318541* (2013.01); *G06F 1/08* (2013.01)

(58) Field of Classification Search
  CPC ............ G01R 31/3177; G01R 31/3181; G01R 31/318536; G01R 31/318541; G01R 31/31704; G06F 1/08
  USPC ................................. 714/727, 726, 729, 724
  See application file for complete search history.

(56) References Cited

U.S. PATENT DOCUMENTS

| | | | | |
|---|---|---|---|---|
| 6,437,623 | B1 * | 8/2002 | Hsu | G01R 31/319 327/202 |
| 7,038,494 | B2 | 5/2006 | Morton | |
| 7,843,218 | B1 * | 11/2010 | Ramaraju | G01R 31/318541 326/46 |
| 8,271,226 | B2 | 9/2012 | Chakravadhanula et al. | |
| 8,461,865 | B2 | 6/2013 | Schlagenhaft | |
| 8,841,952 | B1 * | 9/2014 | Singh | H03K 3/0372 327/202 |
| 8,880,965 | B2 | 11/2014 | Zhang et al. | |
| 10,169,177 | B1 | 1/2019 | Shivaray et al. | |
| 11,012,057 | B2 * | 5/2021 | Huang | H03K 3/0372 |
| 2014/0101501 | A1 * | 4/2014 | Devta Prasanna | G01R 31/318544 714/E11.034 |

OTHER PUBLICATIONS

Mahmoodi-Meimand et al., Data-Retention Flip-Flops for Power-Down Applications, 2004, IEEE, pp. 677-680 (Year: 2004).*

* cited by examiner

*Primary Examiner* — John J Tabone, Jr.

(57) ABSTRACT

A scan flip-flop includes a selection circuit, a primary latch, a secondary latch, and a data retention latch. The selection circuit selects and outputs one of functional data, first reference data, scan data, and first control data as second reference data. The primary latch receives the second reference data and outputs third reference data, whereas the secondary latch receives the third reference data and outputs second control data. The second control data is then provided to a subsequent scan flip-flop of a scan chain. The data retention latch receives one of the third reference data and the second control data, and outputs and provides the first reference data to the selection circuit. The first reference data corresponds to functional data retained in the scan flip-flop during a structural testing mode associated with the scan chain.

20 Claims, 4 Drawing Sheets

DATA RETENTION DURING STRUCTURAL TESTING OF SYSTEM-ON-CHIPS

BACKGROUND

The present disclosure relates generally to electronic circuits, and, more particularly, to data retention during structural testing of system-on-chips (SoCs).

SoCs are typically tested for various structural faults (also referred to as "structural testing") by using scan chains. Each scan chain includes multiple scan flip-flops coupled in series with each other. Further, each scan flip-flop includes a multiplexer and primary and secondary latches. During structural testing of an SoC, a scan pattern is shifted through a scan chain, and a response of various components of the SoC (i.e., functional circuits, combinational circuits, or the like) to the scan pattern is captured to determine whether the SoC has any structural faults. In such a scenario, functional data stored in the scan flip-flops before the initiation of the structural testing is lost (i.e., is overwritten). As a result, upon completion of the structural testing, the SoC is required to be reset which consumes a significant amount of time and can degrade a utilization of the SoC.

To solve the aforementioned problems, each scan flip-flop typically includes an additional latch for retaining the associated functional data during the structural testing of the SoC. Such an additional latch is referred to as a "data retention latch". To facilitate the data retention, each scan flip-flop includes an additional multiplexer that is coupled with the secondary latch and the data retention latch, and selects data associated with the secondary latch or the data retention latch as control data for providing to a subsequent scan flip-flop of the scan chain. As the additional multiplexer is operational even when the SoC is operating in a functional mode, a delay is introduced in the propagation of the functional data through the scan flip-flop. This leads to a significant degradation in a performance (i.e., a throughput) of the SoC. Therefore, there exists a need for a technical solution that solves the aforementioned problems of existing scan flip-flops that retain data during structural testing of SoCs.

SUMMARY

In an embodiment of the present disclosure, a scan flip-flop is disclosed. The scan flip-flop can include a selection circuit and first through third latches. The selection circuit can be configured to output, based on a set of control signals, one of functional data, first reference data, scan data, and first control data as second reference data. The first latch can be coupled with the selection circuit, and configured to receive the second reference data and a first clock signal, and output third reference data. The second latch can be coupled with the first latch, and configured to receive the third reference data and the first clock signal, and output second control data. The third latch can be coupled with the second latch and the selection circuit, and configured to receive one of the third reference data and the second control data, and output and provide the first reference data to the selection circuit.

In another embodiment of the present disclosure, a system-on-chip (SoC) is disclosed. The SoC can include control circuitry that can be configured to output a plurality of control signals, and a scan chain that can include a plurality of scan flip-flops coupled in series with each other. Each scan flip-flop of the plurality of scan flip-flops can include a selection circuit that can be coupled with the control circuitry, and configured to output, based on a set of control signals of the plurality of control signals, one of functional data, first reference data, scan data, and first control data as second reference data. Each scan flip-flop of the plurality of scan flip-flops can further include first through third latches. The first latch can be coupled with the selection circuit, and configured to receive the second reference data and a first clock signal, and output third reference data. The second latch can be coupled with the first latch, and configured to receive the third reference data and the first clock signal, and output second control data. The third latch can be coupled with the second latch and the selection circuit, and configured to receive one of the third reference data and the second control data, and output and provide the first reference data to the selection circuit.

In some embodiments, the selection circuit can output the functional data as the second reference data during a functional mode associated with the scan chain and a capture phase of a structural testing mode associated with the scan chain. During a shift phase of the structural testing mode, the selection circuit can output one of the scan data and the first control data as the second reference data. Further, the selection circuit can output the first reference data as the second reference data after the structural testing mode is deactivated and prior to an activation of the functional mode. The selection circuit can thus facilitate data retention during the structural testing mode.

In some embodiments, the control circuitry can include a processing circuit, a flip-flop, and first and second logic gates. The processing circuit can be configured to output first and second control signals and a second clock signal. The first control signal is deactivated during functional and structural testing modes associated with the scan chain, and activated after the structural testing mode is deactivated and prior to an activation of the functional mode. The flip-flop can be coupled with the processing circuit, and configured to receive the first control signal and the second clock signal, and output a third control signal. The first logic gate can be coupled with the processing circuit and the flip-flop, and configured to receive the first and third control signals, respectively, and output a fourth control signal. The second logic gate can be coupled with the processing circuit and the first logic gate, and configured to receive the second and fourth control signals, respectively, and output a fifth control signal. The set of control signals can include the first and fifth control signals. The fifth control signal is deactivated during the functional mode and a capture phase of the structural testing mode. The fifth control signal is activated during a shift phase of the structural testing mode. The fifth control signal is further activated after the structural testing mode is deactivated and prior to the activation of the functional mode.

In some embodiments, the selection circuit can include first and second multiplexers. The first multiplexer can be coupled with the third latch and the processing circuit, and configured to receive the first reference data and the first control signal, respectively. The first multiplexer can be further configured to receive one of the scan data and the first control data. Based on the first control signal, the first multiplexer can be further configured to select and output one of the scan data, the first control data, and the first reference data as fourth reference data. When the first control signal is deactivated, the first multiplexer can select and output one of the scan data and the first control data as the fourth reference data. Further, when the first control signal is activated, the first multiplexer can select and output the first reference data as the fourth reference data. The second multiplexer can be coupled with the first multiplexer and the second logic gate, and configured to receive the fourth reference data and the fifth control signal, respectively. The second multiplexer can be further configured to receive the functional data. Based on the fifth control signal, the second multiplexer can be further configured to select and output one of the functional data and the fourth reference data as the second reference data. When the fifth control signal is deactivated and activated, the second multiplexer can select and output the functional data and the fourth reference data as the second reference data, respectively.

In some embodiments, the control circuitry can further include a clock gate that can be coupled with the processing circuit and the second logic gate, and configured to receive the second clock signal and the fifth control signal, respectively, and output a third clock signal.

In some embodiments, the SoC can further include a gating circuit that can be coupled with the clock gate, the processing circuit, and the second logic gate, and configured to receive the third clock signal, the first control signal, and the fifth control signal, respectively, and output the first clock signal.

In some embodiments, the first latch can include first and second inverters and first and second transmission gates. The first inverter can be configured to output the third reference data. The first transmission gate has first and second control terminals that can be configured to receive the first clock signal and a fourth clock signal that is an inverted version of the first clock signal, respectively. The first transmission gate further has a first data terminal that can be coupled with the selection circuit, and configured to receive the second reference data. Further, the first transmission gate has a second data terminal that can be coupled with the first inverter, and configured to output and provide the second reference data to the first inverter when the first clock signal is deactivated. The second inverter can be coupled with the first inverter, and configured to receive the third reference data and output fifth reference data. Logic states of the fifth and second reference data can be same. The second transmission gate has first and second control terminals that can be configured to receive the fourth and first clock signals, respectively. The second transmission gate further has first and second data terminals. The first data terminal of the second transmission gate can be coupled with the second inverter, and configured to receive the fifth reference data. The second data terminal of the second transmission gate can be coupled with the first inverter, and configured to output and provide the fifth reference data to the first inverter when the first clock signal is activated. The first inverter can output the third reference data based on the second and fifth reference data when the first clock signal is deactivated and activated, respectively.

In some embodiments, the second latch can include third and fourth inverters and third and fourth transmission gates. The third inverter can be configured to output the second control data. The third transmission gate has first and second control terminals and first and second data terminals. The first control terminal of the third transmission gate can be configured to receive a fourth clock signal that is an inverted version of the first clock signal, and the second control terminal of the third transmission gate can be configured to receive the first clock signal. The first data terminal of the third transmission gate can be coupled with the first latch, and configured to receive the third reference data, and the second data terminal of the third transmission gate can be coupled with the third inverter, and configured to output and provide the third reference data to the third inverter when the first clock signal is activated. The fourth inverter can be coupled with the third inverter, and configured to receive the second control data and output sixth reference data. Logic states of the third and sixth reference data can be same. The fourth transmission gate has first and second control terminals that can be configured to receive the first and fourth clock signals, respectively. The fourth transmission gate further has first and second data terminals. The first data terminal of the fourth transmission gate can be coupled with the fourth inverter, and configured to receive the sixth reference data. The second data terminal of the fourth transmission gate can be coupled with the third inverter, and configured to output and provide the sixth reference data to the third inverter when the first clock signal is deactivated. The third inverter can output the second control data based on the third and sixth reference data when the first clock signal is activated and deactivated, respectively.

In some embodiments, the third latch can include fifth and sixth inverters and fifth and sixth transmission gates. The fifth inverter can be coupled with the selection circuit, and configured to output and provide the first reference data to the selection circuit. The fifth transmission gate has first and second control terminals that can be configured to receive a sixth control signal of the plurality of control signals, and a seventh control signal that is an inverted version of the sixth control signal, respectively. The fifth transmission gate further has first and second data terminals. The first data terminal of the fifth transmission gate can be coupled with the second data terminal of the third transmission gate, and configured to receive the third reference data. Further, the second data terminal of the fifth transmission gate can be coupled with the fifth inverter, and configured to output and provide the third reference data to the fifth inverter when the sixth control signal is deactivated. The sixth control signal is deactivated and activated during the functional and structural testing modes associated with the scan chain, respectively. The sixth inverter can be coupled with the fifth inverter, and configured to receive the first reference data and output seventh reference data. A logic state of the seventh reference data can be same as the logic state of the third reference data. The sixth transmission gate has first and second control terminals that can be configured to receive the seventh and sixth control signals, respectively. The sixth transmission gate further has first and second data terminals. The first data terminal of the sixth transmission gate can be coupled with the sixth inverter, and configured to receive the seventh reference data. The second data terminal of the sixth transmission gate can be coupled with the fifth inverter, and configured to output and provide the seventh reference data to the fifth inverter when the sixth control signal is activated.

In some embodiments, the third latch can further include a seventh transmission gate that has first and second control terminals configured to receive the first and fourth clock signals, respectively. The seventh transmission gate further has first and second data terminals. The first data terminal of the seventh transmission gate can be coupled with the sixth inverter, and configured to receive the seventh reference data. Further, the second data terminal of the seventh transmission gate can be coupled with the fifth inverter, and configured to output and provide the seventh reference data to the fifth inverter when the first clock signal is deactivated. The fifth inverter can output the first reference data based on the third reference data when the sixth control signal is deactivated. The fifth inverter can output the first reference data based on the seventh reference data when at least one of the first clock signal is deactivated and the sixth control signal is activated.

In some embodiments, the third latch can include seventh and eighth inverters and eighth and ninth transmission gates. The seventh inverter can be configured to output eighth reference data. The eighth transmission gate has first and second control terminals that can be configured to receive the sixth and seventh control signals, respectively. The eighth transmission gate further has first and second data terminals. The first data terminal of the eighth transmission gate can be coupled with the second latch, and configured to receive the second control data. Further, the second data terminal of the eighth transmission gate can be coupled with the seventh inverter, and configured to output and provide the second control data to the seventh inverter when the sixth control signal is deactivated. The sixth control signal is deactivated and activated during the functional and structural testing modes associated with the scan chain, respectively. The eighth inverter can be coupled with the seventh inverter and the selection circuit, and configured to receive the eighth reference data and output and provide the first reference data to the selection circuit. Logic states of the first reference data and the second control data can be same. The ninth transmission gate has first and second control terminals that can be configured to receive the seventh and sixth control signals, respectively. The ninth transmission gate further has first and second data terminals. The first data terminal of the ninth transmission gate can be coupled with the eighth inverter, and configured to receive the first reference data. The second data terminal of the ninth transmission gate can be coupled with the seventh inverter, and configured to output and provide the first reference data to the seventh inverter when the sixth control signal is activated. The seventh inverter can output the eighth reference data based on the second control data and the first reference data when the sixth control signal is deactivated and activated, respectively.

Various embodiments of the present disclosure disclose an SoC that can include control circuitry and a scan chain. The control circuitry can output various control signals. The scan chain can include various scan flip-flops coupled in series with each other. Each scan flip-flop of the scan chain can include a selection circuit that can select and output, based on the control signals outputted by the control circuitry, one of functional data, first reference data, scan data, and first control data as second reference data. The selection circuit can include various multiplexers for executing the selection operation. Each scan flip-flop of the scan chain can further include a primary latch, a secondary latch, and a data retention latch. The primary latch can receive the second reference data and output third reference data, and the secondary latch can receive the third reference data and output second control data. The data retention latch can receive one of the third reference data and the second control data, and output and provide the first reference data to the selection circuit. The first reference data corresponds to functional data retained in the data retention latch during the structural testing of the SoC.

Thus, in the scan flip-flop of the present disclosure, the multiplexer that facilitates the data retention during the structural testing of the SoC is not included in a functional data propagation path associated with the scan flip-flop. In other words, when the SoC operates in a functional mode, a delay is not introduced in the propagation of functional data through the scan flip-flop of the present disclosure. Hence, a time required for functional data to propagate through the scan flip-flop of the present disclosure is significantly less than that required for propagating through a conventional scan flip-flop that includes a multiplexer in the functional data propagation path. Thus, a performance (i.e., a throughput) of the SoC of the present disclosure is significantly greater than that of an SoC that includes the conventional scan flip-flop.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
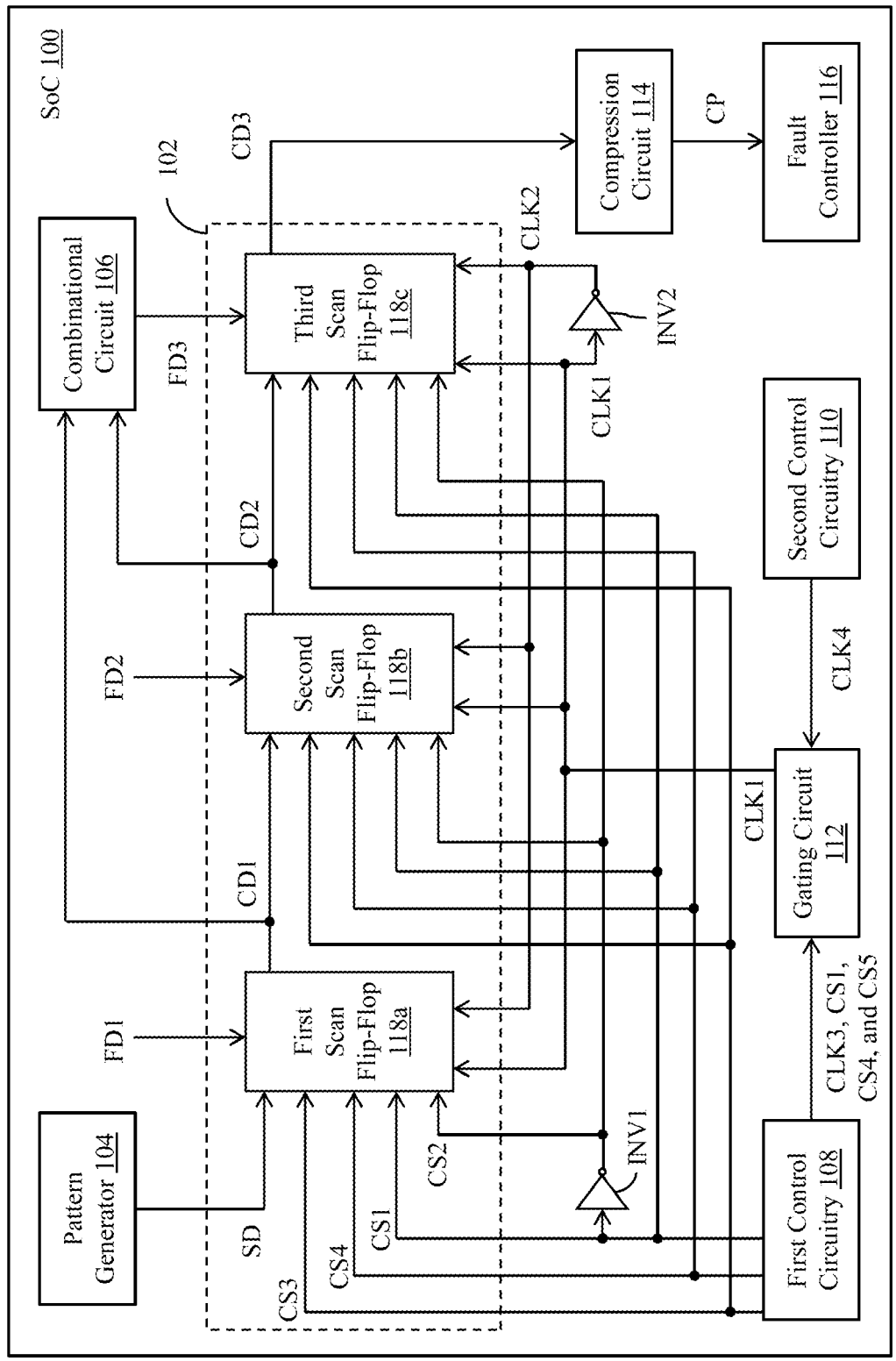
FIG. 1 illustrates a schematic block diagram of a system-on-chip (SoC) in accordance with an embodiment of the present disclosure.

FIG. 1 illustrates a schematic block diagram of a system-on-chip (SoC) 100 in accordance with an embodiment of the present disclosure. The SoC 100 can include a scan chain 102, a pattern generator 104, a combinational circuit 106, first and second control circuitries 108 and 110, a gating circuit 112, a compression circuit 114, and a fault controller 116. The SoC 100 can further include first and second inverters INV1 and INV2. The SoC 100 can be utilized in various consumer electronic devices (e.g., mobile phones, digital cameras, and media players), various automotive devices, various data processing devices, various networking devices, or the like.

The scan chain 102 can include a plurality of scan flip-flops of which first through third scan flip-flops 118a-118c are shown. The first through third scan flip-flops 118a-118c can be coupled in series with each other. Further, it will be apparent to a person skilled in the art that inputs to the scan chain 102 can be x-bounded by an x-bounding circuit (not shown). The scan chain 102 can be configured to operate in various modes, namely, a functional mode and a structural testing mode. The scan chain 102 can operate in the functional mode when the SoC 100 is operating in a default mode (i.e., in an associated functional mode). When structural testing of the SoC 100 is initiated, the scan chain 102 can operate in the structural testing mode. The structural testing of the SoC 100 can correspond to a scan testing of the SoC 100 or a self-testing of the SoC 100. Further, the structural testing mode associated with the scan chain 102 can include a shift phase and a capture phase.

The first scan flip-flop 118a can be coupled with a first functional circuit (not shown), the pattern generator 104, the first control circuitry 108, the first inverter INV1, the gating circuit 112, and the second inverter INV2. The first scan flip-flop 118a can be configured to receive first functional data FD1 and scan data SD from the first functional circuit and the pattern generator 104, respectively. The scan data SD is part of a scan pattern (i.e., a sequence of data) generated by the pattern generator 104 for the structural testing of the SoC 100. Thus, during the structural testing of the SoC 100, the first scan flip-flop 118a receives the scan pattern in a sequential manner. The first scan flip-flop 118a can be further configured to receive first and second control signals CS1 and CS2 from the first control circuitry 108 and the first inverter INV1, respectively. The first control signal CS1 can indicate whether the structural testing of the SoC 100 is initiated (i.e., whether the structural testing mode is activated). Further, the second control signal CS2 is an inverted version of the first control signal CS1. In an embodiment, the first control signal CS1 is deactivated (i.e., is at a logic low state) during the functional mode, and activated (i.e., is at a logic high state) during the structural testing mode. Further, the second control signal CS2 is activated (i.e., is at a logic high state) during the functional mode, and deactivated (i.e., is at a logic low state) during the structural testing mode.

The first scan flip-flop 118a can be further configured to receive third and fourth control signals CS3 and CS4 from the first control circuitry 108. The third control signal CS3 can indicate whether the structural testing of the SoC 100 is completed (i.e., whether the structural testing mode is deactivated). In an embodiment, the third control signal CS3 is deactivated (i.e., is at a logic low state) during the functional and structural testing modes. Further, the third control signal CS3 is activated (i.e., is at a logic high state) after the structural testing of the SoC 100 is completed. In other words, the third control signal CS3 is activated after the structural testing mode is deactivated and prior to an activation of the functional mode. The fourth control signal CS4 can correspond to a scan-enable signal associated with the scan chain 102. In an embodiment, the fourth control signal CS4 is deactivated (i.e., is at a logic low state) during the functional mode and the capture phase of the structural testing mode. Further, the fourth control signal CS4 is activated (i.e., is at a logic high state) during the shift phase of the structural testing mode. The fourth control signal CS4 is further activated after the structural testing mode is deactivated and prior to the activation of the functional mode.

The first scan flip-flop 118a can be further configured to receive first and second clock signals CLK1 and CLK2 from the gating circuit 112 and the second inverter INV2, respectively. The second clock signal CLK2 is an inverted version of the first clock signal CLK1. Further, the first scan flip-flop 118a can be configured to output first control data CD1 based on the first functional data FD1, the scan data SD, the first through fourth control signals CS1-CS4, and the first and second clock signals CLK1 and CLK2. The first scan flip-flop 118a is explained in detail in conjunction with FIGS. 3A and 3B.

The second and third scan flip-flops 118b and 118c can be structurally and functionally similar to the first scan flip-flop 118a. The second scan flip-flop 118b can be coupled with a second functional circuit (not shown), the first scan flip-flop 118a, the first control circuitry 108, the first and second inverters INV1 and INV2, and the gating circuit 112. Further, the second scan flip-flop 118b can be configured to receive second functional data FD2 and the first control data CD1 from the second functional circuit and the first scan flip-flop 118a, respectively. The second scan flip-flop 118b can be further configured to receive the first, third, and fourth control signals CS1, CS3, and CS4 from the first control circuitry 108, and the second control signal CS2 from the first inverter INV1. The second scan flip-flop 118b can be further configured to receive the first and second clock signals CLK1 and CLK2 from the gating circuit 112 and the second inverter INV2, respectively. Based on the second functional data FD2, the first control data CD1, the first through fourth control signals CS1-CS4, and the first and second clock signals CLK1 and CLK2, the second scan flip-flop 118b can be further configured to output second control data CD2.

The third scan flip-flop 118c can be coupled with the combinational circuit 106, the second scan flip-flop 118b, the first control circuitry 108, the first and second inverters INV1 and INV2, and the gating circuit 112. The third scan flip-flop 118c can be configured to receive third functional data FD3 and the second control data CD2 from the combinational circuit 106 and the second scan flip-flop 118b, respectively. Further, the third scan flip-flop 118c can be configured to receive the first, third, and fourth control signals CS1, CS3, and CS4 from the first control circuitry 108, and the second control signal CS2 from the first inverter INV1. The third scan flip-flop 118c can be further configured to receive the first and second clock signals CLK1 and CLK2 from the gating circuit 112 and the second inverter INV2, respectively. Based on the third functional data FD3, the second control data CD2, the first through fourth control signals CS1-CS4, and the first and second clock signals CLK1 and CLK2, the third scan flip-flop 118c can be further configured to output third control data CD3.

During the functional mode associated with the scan chain 102, the first through third scan flip-flops 118a-118c output the first through third functional data FD1-FD3 as the first through third control data CD1-CD3, respectively. In an embodiment, the first through third control data CD1-CD3 are outputted at a positive edge of the first clock signal CLK1. When the structural testing of the SoC 100 is initiated, the scan chain 102 (i.e., the first through third scan flip-flops 118a-118c) operates in the structural testing mode. Prior to the activation of the structural testing mode associated with the scan chain 102, functional data (such as the first through third functional data FD1-FD3) associated with each scan flip-flop of the first through third scan flip-flops 118a-118c is stored therein.

During the shift phase of the structural testing mode, the scan pattern generated by the pattern generator 104 is shifted through the scan chain 102 in various cycles of the first clock signal CLK1. For the sake of ongoing discussion, it is assumed that the scan pattern includes three different data. Thus, during the shift phase of the structural testing mode, the first through third scan flip-flops 118a-118c output the scan data SD, the first control data CD1, and the second control data CD2 as the first through third control data CD1-CD3, respectively. In an embodiment, the first through third control data CD1-CD3 are outputted at the positive edge of the first clock signal CLK1. Thus, in three cycles of the first clock signal CLK1, the scan pattern is shifted through the scan chain 102. During the shift phase of the structural testing mode, the output of the combinational circuit 106 is updated based on the scan pattern.

During the capture phase of the structural testing mode, a response of the SoC 100 to the scan pattern is captured (e.g., the updated output of the combinational circuit 106). In other words, during the capture phase of the structural testing mode, the first through third scan flip-flops 118a-118c output the first through third functional data FD1-FD3 as the first through third control data CD1-CD3, respectively. In an embodiment, the first through third control data CD1-CD3 are outputted at the positive edge of the first clock signal CLK1. The capture phase is followed by another shift phase where the captured response is shifted through the scan chain 102. Thus, in another three cycles of the first clock signal CLK1, the captured response is provided to the compression circuit 114 by way of the third control data CD3. The third control data CD3 outputted for the three cycles of the first clock signal CLK1 can then be utilized by the compression circuit 114 and the fault controller 116 to initiate a fault diagnosis of the SoC 100.

When the structural testing of the SoC 100 is completed, the scan chain 102 does not transition to the functional mode immediately. The third control signal CS3 and the first and second clock signals CLK1 and CLK2 are outputted such that the third control signal CS3 is activated for an additional cycle of the first clock signal CLK1 after the structural testing of the SoC 100 is completed (i.e., after the structural testing mode is deactivated). The additional cycle of the first clock signal CLK1 corresponds to a time duration between the deactivation of the structural testing mode and the activation of the functional mode. During such cycle of the first clock signal CLK1, functional data stored in each of the first through third scan flip-flops 118a-118c prior to the activation of the structural testing mode is outputted by each of the first through third scan flip-flops 118a-118c, thereby facilitating data retention during the structural testing mode. The scan chain 102 can then operate in the functional mode until the structural testing of the SoC 100 is subsequently initiated.

Although FIG. 1 illustrates that the scan chain 102 includes three scan flip-flops (i.e., the first through third scan flip-flops 118a-118c), it will be apparent to a person skilled in the art that the scope of the present disclosure is not limited to it. In various other embodiments, the scan chain 102 can include more than three scan flip-flops, without deviating from the scope of the present disclosure. It will also be apparent to a person skilled in the art that the scope of the present disclosure is not limited to the SoC 100 including a single scan chain (i.e., the scan chain 102). In various other embodiments, the SoC 100 can include more than one scan chain, without deviating from the scope of the present disclosure. In such a scenario, each additional scan chain can operate in a manner similar to that of the scan chain 102.

The pattern generator 104 can be coupled with the first scan flip-flop 118a. The pattern generator 104 can include suitable circuitry that can be configured to perform one or more operations. For example, the pattern generator 104 can be configured to generate, based on configuration data (not shown), the scan pattern that includes the scan data SD. The pattern generator 104 can be further configured to provide the scan data SD to the first scan flip-flop 118a. The scan pattern can thus be provided to the scan chain 102 by way of the first scan flip-flop 118a. When the structural testing of the SoC 100 corresponds to the self-testing, the pattern generator 104 can correspond to a pseudo-random pattern generator. When the structural testing of the SoC 100 corresponds to the scan testing, the pattern generator 104 can correspond to a deterministic pattern generator.

The combinational circuit 106 can be coupled with the first through third scan flip-flops 118a-118c. The combinational circuit 106 can be configured to receive the first and second control data CD1 and CD2 from the first and second scan flip-flops 118a and 118b, respectively. Based on the first and second control data CD1 and CD2, the combinational circuit 106 can be further configured to generate the third functional data FD3. Further, the combinational circuit 106 can be configured to provide the third functional data FD3 to the third scan flip-flop 118c. Examples of the combinational circuit 106 can include adders, encoders, or the like.

The first control circuitry 108 can be coupled with the first through third scan flip-flops 118a-118c and the gating circuit 112. The first control circuitry 108 can be configured to output and provide the first, third, and fourth control signals CS1, CS3, and CS4 to each of the first through third scan flip-flops 118a-118c. Further, the first control circuitry 108 can be configured to output a third clock signal CLK3 and a fifth control signal CS5. The fifth control signal CS5 corresponds to a pulse signal. In an embodiment, the first control circuitry 108 activates the fifth control signal CS5 (i.e., generates the fifth control signal CS5 at a logic high state) during the capture phase of the structural testing mode. Further, the first control circuitry 108 deactivates the fifth control signal CS5 (i.e., generates the fifth control signal CS5 at a logic low state) during the functional mode and the shift phase of the structural testing mode. The first control circuitry 108 can be further configured to provide the first, fourth, and fifth control signals CS1, CS4, and CS5 and the third clock signal CLK3 to the gating circuit 112. The first, third, fourth, and fifth control signals CS1, CS3, CS4, and CS5 and the third clock signal CLK3 outputted by the first control circuitry 108 can control an operation of the scan chain 102 (i.e., the first through third scan flip-flops 118a-118c) during the structural testing mode associated with the scan chain 102. The first control circuitry 108 is explained in detail in conjunction with FIG. 2.

The first inverter INV1 can be coupled with the first control circuitry 108 and the first through third scan flip-flops 118a-118c. The first inverter INV1 can be configured to receive the first control signal CS1 from the first control circuitry 108. Further, the first inverter INV1 can be configured to output and provide the second control signal CS2 to each of the first through third scan flip-flops 118a-118c. The second control signal CS2 can be the inverted version of the first control signal CS1.

The second control circuitry 110 can be coupled with the gating circuit 112. The second control circuitry 110 can be configured to output and provide a fourth clock signal CLK4 to the gating circuit 112. The fourth clock signal CLK4 outputted by the second control circuitry 110 can control the operation of the scan chain 102 (i.e., the first through third scan flip-flops 118a-118c) during the functional mode associated with the scan chain 102.

The gating circuit 112 can be coupled with the first and second control circuitries 108 and 110, and the first through third scan flip-flops 118a-118c. The gating circuit 112 can include suitable circuitry that can be configured to perform one or more operations. For example, the gating circuit 112 can be configured to receive the first, fourth, and fifth control signals CS1, CS4, and CS5 and the third clock signal CLK3 from the first control circuitry 108, and the fourth clock signal CLK4 from the second control circuitry 110. The gating circuit 112 can be further configured to output and provide the first clock signal CLK1 to each of the first through third scan flip-flops 118a-118c.

During the functional mode, the gating circuit 112 can output the first clock signal CLK1 based on the fourth clock signal CLK4 and the first control signal CS1. During the shift phase of the structural testing mode, the gating circuit 112 can output the first clock signal CLK1 based on the first and fourth control signals CS1 and CS4 and the third clock signal CLK3. Further, during the capture phase of the structural testing mode, the gating circuit 112 can output the first clock signal CLK1 based on the first, fourth, and fifth control signals CS1, CS4, and CS5 and the third clock signal CLK3. The gating circuit 112 can output the first clock signal CLK1 based on the first and fourth control signals CS1 and CS4 and the third clock signal CLK3 after the structural testing mode is deactivated and prior to the activation of the functional mode.

The second inverter INV2 can be coupled with the gating circuit 112 and the first through third scan flip-flops 118a-118c. The second inverter INV2 can be configured to receive the first clock signal CLK1 from the gating circuit 112. Further, the second inverter INV2 can be configured to output and provide the second clock signal CLK2 to each of the first through third scan flip-flops 118a-118c. The second clock signal CLK2 can be the inverted version of the first clock signal CLK1.

The compression circuit 114 can be coupled with the third scan flip-flop 118c. The compression circuit 114 can include suitable circuitry that can be configured to perform one or more operations. For example, the compression circuit 114 can be configured to receive the third control data CD3 from the third scan flip-flop 118c. During the structural testing mode, the compression circuit 114 can receive the captured response of the SoC 100 to the scan pattern by way of the third control data CD3 over various cycles of the first clock signal CLK1. The compression circuit 114 can be further configured to generate compressed data CP by compressing the third control data CD3 received over various cycles of the first clock signal CLK1. When the structural testing of the SoC 100 corresponds to the scan testing, the compressed data CP can be generated for each scan pattern. When the structural testing corresponds to the self-testing, the compressed data CP can be generated after the structural testing of the SoC 100 is completed. In such a scenario, the compressed data CP may correspond to a multi-input signature register (MISR) value.

The fault controller 116 can be coupled with the compression circuit 114. The fault controller 116 can include suitable circuitry that can be configured to perform one or more operations. For example, the fault controller 116 can be configured to receive the compressed data CP from the compression circuit 114. The fault controller 116 can be further configured to retrieve result data (not shown) from a memory (not shown) associated with the fault controller 116. When the structural testing corresponds to the self-testing, the result data can correspond to a reference MISR value. The fault controller 116 can be further configured to compare the compressed data CP and the result data. Based on the result of the comparison, the fault controller 116 can be further configured to initiate the fault diagnosis of the SoC 100. In an embodiment, when the compressed data CP does not match the result data, the fault controller 116 can be configured to safe-state outputs of various components of the SoC 100. The fault controller 116 can be further configured to reset the SoC 100. When the compressed data CP matches the result data, the SoC 100 can continue to operate in the functional mode.

Figure 2:
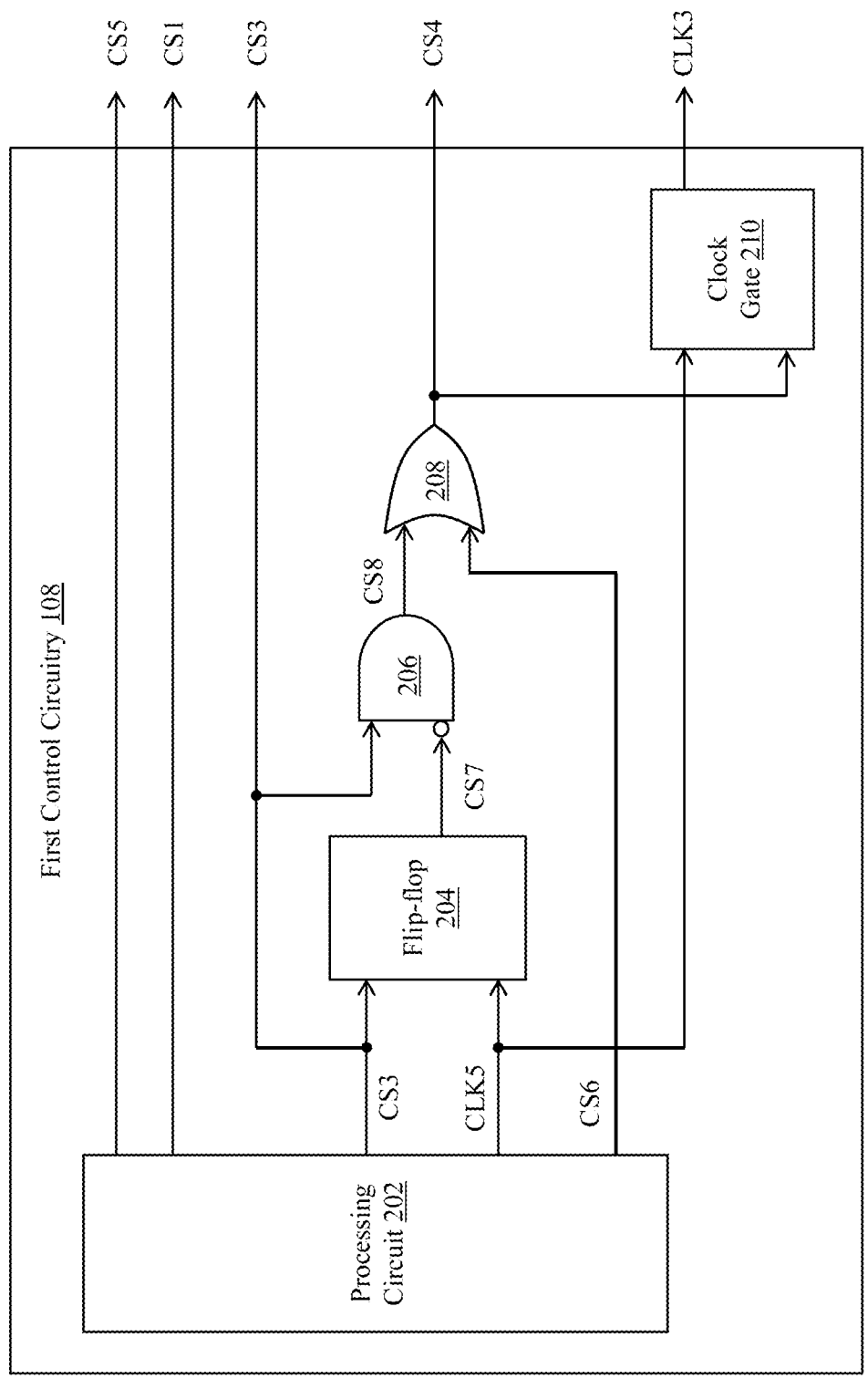
FIG. 2 illustrates a schematic block diagram of first control circuitry of the SoC of FIG. 1 in accordance with an embodiment of the present disclosure.

FIG. 2 illustrates a schematic block diagram of the first control circuitry 108 in accordance with an embodiment of the present disclosure. The first control circuitry 108 can include a processing circuit 202, a flip-flop 204, first and second logic gates 206 and 208, and a clock gate 210. In one embodiment, the first control circuitry 108 corresponds to a test controller (e.g., a self-test controller or a scan test controller) associated with the SoC 100. In another embodiment, the processing circuit 202 corresponds to the test controller associated with the SoC 100.

The processing circuit 202 can include suitable circuitry that can be configured to perform one or more operations. For example, the processing circuit 202 can be configured to output the first, third, and fifth control signals CS1, CS3, and CS5. The processing circuit 202 can be further configured to output a fifth clock signal CLK5 and a sixth control signal CS6. The fifth clock signal CLK5 and the sixth control signal CS6 are outputted by the processing circuit 202 to control the operation of the scan chain 102 during the structural testing mode associated therewith. The processing circuit 202 activates the sixth control signal CS6 (i.e., generates the sixth control signal CS6 at a logic high state) during the shift phase of the structural testing mode. Further, the processing circuit 202 deactivates the sixth control signal CS6 (i.e., generates the sixth control signal CS6 at a logic low state) during the functional mode and the capture phase of the structural testing mode. The processing circuit 202 further deactivates the sixth control signal CS6 after the structural testing mode is deactivated and prior to the activation of the functional mode.

The flip-flop 204 has an input terminal and a clock terminal that can be coupled with the processing circuit 202. The input terminal and the clock terminal of the flip-flop 204 can be configured to receive the third control signal CS3 and the fifth clock signal CLK5 from the processing circuit 202, respectively. In an embodiment, the clock terminal of the flip-flop 204 corresponds to a positive clock terminal. The flip-flop 204 further has an output terminal that can be configured to output a seventh control signal CS7 based on the third control signal CS3 and the fifth clock signal CLK5. The flip-flop 204 outputs the seventh control signal CS7 at a positive edge of the fifth clock signal CLK5. Thus, when the third control signal CS3 is activated on the completion of the structural testing of the SoC 100, the seventh control signal CS7 is activated after one cycle of the fifth clock signal CLK5. In other words, the seventh control signal CS7 remains deactivated for one cycle of the fifth clock signal CLK5 after the activation of the third control signal CS3. In an embodiment, the flip-flop 204 is a D flip-flop.

The first logic gate 206 has first and second input terminals that can be coupled with the processing circuit 202 and the output terminal of the flip-flop 204, respectively. The first and second input terminals of the first logic gate 206 can be configured to receive the third and seventh control signals CS3 and CS7 from the processing circuit 202 and the output terminal of the flip-flop 204, respectively. In an embodiment, the first and second input terminals of the first logic gate 206 correspond to positive and negative input terminals, respectively. The first logic gate 206 further has an output terminal that can be configured to output an eighth control signal CS8. In an embodiment, the eighth control signal CS8 is activated (i.e., is at a logic high state) when the third control signal CS3 is activated and the seventh control signal CS7 is deactivated (i.e., is at a logic low state). Conversely, the eighth control signal CS8 is deactivated (i.e., is at a logic low state) when the third control signal CS3 is deactivated or the seventh control signal CS7 is activated (i.e., is at a logic high state). In an embodiment, the first logic gate 206 is an AND gate.

The second logic gate 208 has first and second input terminals that can be coupled with the output terminal of the first logic gate 206 and the processing circuit 202, respectively. The first and second input terminals of the second logic gate 208 can be configured to receive the eighth and sixth control signals CS8 and CS6 from the output terminal of the first logic gate 206 and the processing circuit 202, respectively. In an embodiment, the first and second input terminals of the second logic gate 208 correspond to positive input terminals. The second logic gate 208 further has an output terminal that can be configured to output the fourth control signal CS4. In an embodiment, the fourth control signal CS4 is activated (i.e., is at a logic high state) when the eighth or sixth control signal CS8 or CS6 is activated. Conversely, the fourth control signal CS4 is deactivated when the eighth and sixth control signals CS8 and CS6 are deactivated. Thus, the fourth control signal CS4 is deactivated during the functional mode and the capture phase of the structural testing mode, and activated during the shift phase of the structural testing mode. The fourth control signal CS4 is further activated after the structural testing mode is deactivated and prior to the activation of the functional mode. In an embodiment, the second logic gate 208 is an OR gate.

The clock gate 210 has input and control terminals that can be coupled with the processing circuit 202 and the output terminal of the second logic gate 208, respectively. The input and control terminals of the clock gate 210 can be configured to receive the fifth clock signal CLK5 and the fourth control signal CS4 from the processing circuit 202 and the output terminal of the second logic gate 208, respectively. The clock gate 210 further has an output terminal that can be configured to output the third clock signal CLK3 based on the fifth clock signal CLK5 and the fourth control signal CS4. In an embodiment, the output terminal of the clock gate 210 outputs the fifth clock signal CLK5 as the third clock signal CLK3 when the fourth control signal CS4 is activated.

Figure 3A:
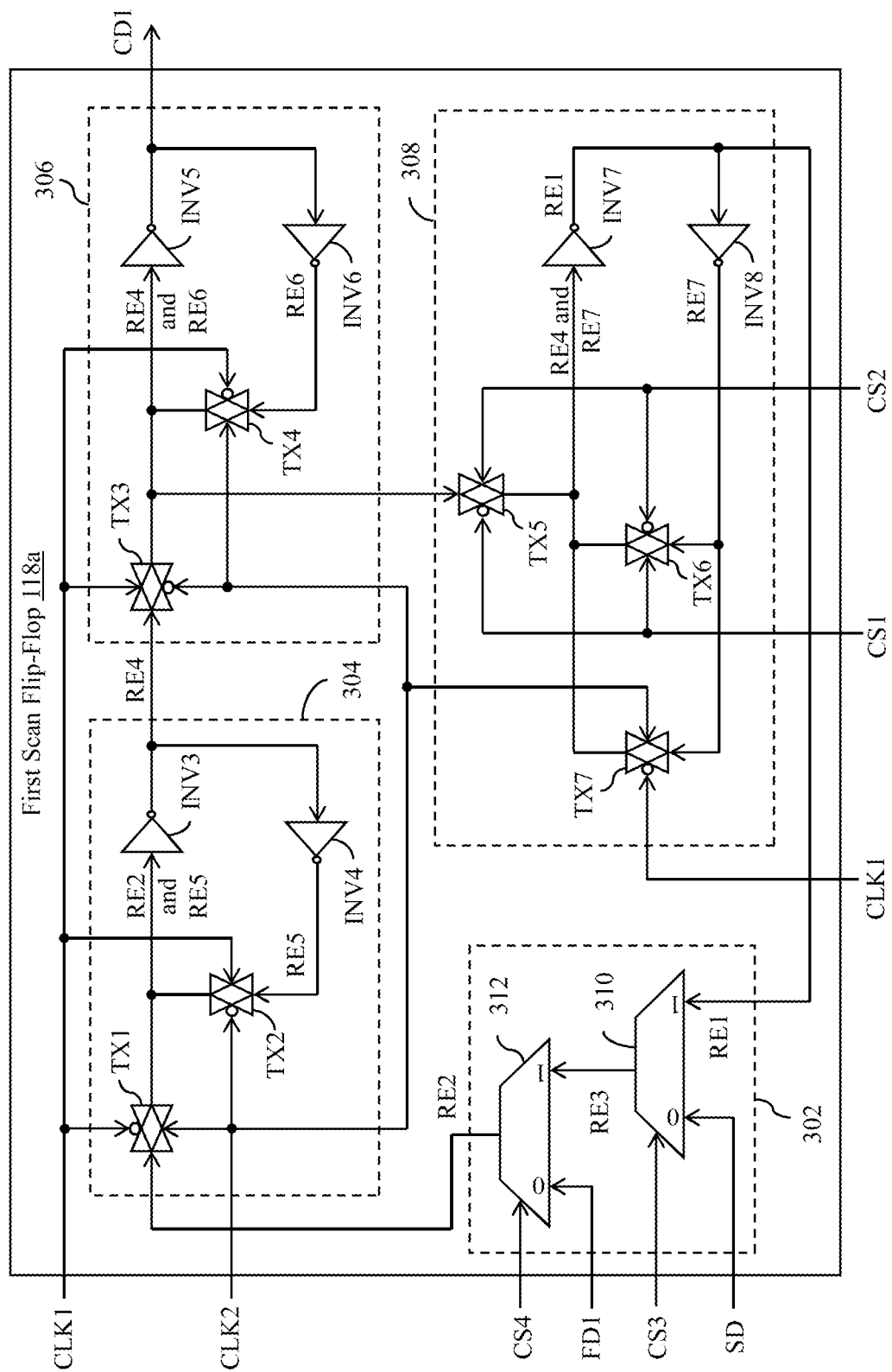
FIG. 3A illustrates a schematic circuit diagram of a first scan flip-flop of the SoC of FIG. 1 in accordance with an embodiment of the present disclosure.

FIG. 3A illustrates a schematic circuit diagram of the first scan flip-flop 118a in accordance with an embodiment of the present disclosure. The first scan flip-flop 118a can include a selection circuit 302, and first through third latches 304-308.

The selection circuit 302 can be coupled with the first control circuitry 108, the first functional circuit, and the pattern generator 104. The selection circuit 302 can be configured to receive the third and fourth control signals CS3 and CS4 from the first control circuitry 108, the scan data SD from the pattern generator 104, and the first functional data FD1 from the first functional circuit. Further, the selection circuit 302 can be configured to receive first reference data RE1. The first reference data RE1 corresponds to functional data retained in the first scan flip-flop 118a during the structural testing of the SoC 100. Based on the third and fourth control signals CS3 and CS4, the selection circuit 302 can be further configured to select and output one of the first functional data FD1, the first reference data RE1, and the scan data SD as second reference data RE2.

The selection circuit 302 can output the first functional data FD1 as the second reference data RE2 during the functional mode associated with the scan chain 102 and the capture phase of the structural testing mode associated with the scan chain 102. During the shift phase of the structural testing mode, the selection circuit 302 can output the scan data SD as the second reference data RE2. Further, the selection circuit 302 can output the first reference data RE1 as the second reference data RE2 after the structural testing mode is deactivated and prior to the activation of the functional mode. The selection circuit 302 can thus facilitate the data retention during the structural testing mode (i.e., during the structural testing of the SoC 100). The selection circuit 302 can include first and second multiplexers 310 and 312.

The first multiplexer 310 has a first input terminal and a control terminal that can be coupled with the pattern generator 104 and the first control circuitry 108 (i.e., the processing circuit 202), respectively. The first input terminal and the control terminal of the first multiplexer 310 can be configured to receive the scan data SD and the third control signal CS3 from the pattern generator 104 and the first control circuitry 108 (i.e., the processing circuit 202), respectively. The first multiplexer 310 further has a second input terminal that can be configured to receive the first reference data RE1. Further, the first multiplexer 310 can be configured to select and output, at an output terminal thereof based on the third control signal CS3, one of the scan data SD and the first reference data RE1 as third reference data RE3. In an embodiment, when the third control signal CS3 is deactivated, the first multiplexer 310 selects and outputs the scan data SD as the third reference data RE3 at the output terminal thereof. Further, when the third control signal CS3 is activated, the first multiplexer 310 selects and outputs the first reference data RE1 as the third reference data RE3 at the output terminal thereof.

The second multiplexer 312 has first and second input terminals and a control terminal that can be coupled with the first functional circuit, the output terminal of the first multiplexer 310, and the first control circuitry 108 (i.e., the output terminal of the second logic gate 208). The first and second input terminals of the second multiplexer 312 can be configured to receive the first functional data FD1 and the third reference data RE3 from the first functional circuit and the output terminal of the first multiplexer 310, respectively. Further, the control terminal of the second multiplexer 312 can be configured to receive the fourth control signal CS4 from the first control circuitry 108 (i.e., the output terminal of the second logic gate 208). The second multiplexer 312 can be configured to select and output, at an output terminal thereof based on the fourth control signal CS4, one of the first functional data FD1 and the third reference data RE3 as the second reference data RE2. In an embodiment, when the fourth control signal CS4 is deactivated and activated, the second multiplexer 312 selects and outputs the first functional data FD1 and the third reference data RE3 as the second reference data RE2 at the output terminal thereof, respectively.

The first latch 304 can be coupled with the selection circuit 302 (i.e., the output terminal of the second multiplexer 312), the gating circuit 112, and the second inverter INV2. The first latch 304 can be configured to receive the second reference data RE2 and the first and second clock signals CLK1 and CLK2 from the selection circuit 302 (i.e., the output terminal of the second multiplexer 312), the gating circuit 112, and the second inverter INV2, respectively. Based on the second reference data RE2 and the first and second clock signals CLK1 and CLK2, the first latch 304 can be further configured to output fourth reference data RE4. The first latch 304 can correspond to a primary latch of the first scan flip-flop 118a. The first latch 304 can include third and fourth inverters INV3 and INV4 and first and second transmission gates TX1 and TX2. The third inverter INV3 can be configured to output the fourth reference data RE4.

The first transmission gate TX1 has first and second control terminals and first and second data terminals that can be coupled with the gating circuit 112, the second inverter INV2, the selection circuit 302 (i.e., the output terminal of the second multiplexer 312), and the third inverter INV3, respectively. The first and second control terminals of the first transmission gate TX1 can be configured to receive the first and second clock signals CLK1 and CLK2 from the gating circuit 112 and the second inverter INV2, respectively. In an embodiment, the first and second control terminals of the first transmission gate TX1 correspond to negative and positive control terminals, respectively. The first data terminal of the first transmission gate TX1 can be configured to receive the second reference data RE2 from the selection circuit 302 (i.e., the output terminal of the second multiplexer 312). Further, the second data terminal of the first transmission gate TX1 can be configured to output and provide the second reference data RE2 to the third inverter INV3 when the first clock signal CLK1 is deactivated.

The fourth inverter INV4 can be coupled with the third inverter INV3. The fourth inverter INV4 can be configured to receive the fourth reference data RE4 from the third inverter INV3, and output fifth reference data RE5. The fifth reference data RE5 can be outputted such that logic states of the second and fifth reference data RE2 and RE5 are same.

The second transmission gate TX2 has first and second control terminals and first and second data terminals that can be coupled with the second inverter INV2, the gating circuit 112, the fourth inverter INV4, and the third inverter INV3, respectively. The first and second control terminals of the second transmission gate TX2 can be configured to receive the second and first clock signals CLK2 and CLK1 from the second inverter INV2 and the gating circuit 112, respectively. In an embodiment, the first and second control terminals of the second transmission gate TX2 correspond to negative and positive control terminals, respectively. The first data terminal of the second transmission gate TX2 can be configured to receive the fifth reference data RE5 from the fourth inverter INV4. Further, the second data terminal of the second transmission gate TX2 can be configured to output and provide the fifth reference data RE5 to the third inverter INV3 when the first clock signal CLK1 is activated. Thus, the third inverter INV3 can output the fourth reference data RE4 based on the second and fifth reference data RE2 and RE5 when the first clock signal CLK1 is deactivated and activated, respectively.

The second latch 306 can be coupled with the first latch 304 (i.e., the third inverter INV3), the gating circuit 112, and the second inverter INV2. The second latch 306 can be configured to receive the fourth reference data RE4 and the first and second clock signals CLK1 and CLK2 from the first latch 304 (i.e., the third inverter INV3), the gating circuit 112, and the second inverter INV2, respectively. Based on the fourth reference data RE4 and the first and second clock signals CLK1 and CLK2, the second latch 306 can be further configured to output the first control data CD1. Further, the second latch 306 can be coupled with the second scan flip-flop 118b. The second latch 306 can be further configured to provide the first control data CD1 to the second scan flip-flop 118b. The second latch 306 can correspond to a secondary latch of the first scan flip-flop 118a. The second latch 306 can include fifth and sixth inverters INV5 and INV6 and third and fourth transmission gates TX3 and TX4. The fifth inverter INV5 can be configured to output the first control data CD1.

The third transmission gate TX3 has first and second control terminals and first and second data terminals that can be coupled with the second inverter INV2, the gating circuit 112, the first latch 304 (i.e., the third inverter INV3), and the fifth inverter INV5, respectively. The first and second control terminals of the third transmission gate TX3 can be configured to receive the second and first clock signals CLK2 and CLK1 from the second inverter INV2 and the gating circuit 112, respectively. In an embodiment, the first and second control terminals of the third transmission gate TX3 correspond to negative and positive control terminals, respectively. The first data terminal of the third transmission gate TX3 can be configured to receive the fourth reference data RE4 from the first latch 304 (i.e., the third inverter INV3). The second data terminal of the third transmission gate TX3 can be configured to output and provide the fourth reference data RE4 to the fifth inverter INV5 when the first clock signal CLK1 is activated.

The sixth inverter INV6 can be coupled with the fifth inverter INV5. The sixth inverter INV6 can be configured to receive the first control data CD1 from the fifth inverter INV5, and output sixth reference data RE6. The sixth reference data RE6 can be outputted such that logic states of the fourth and sixth reference data RE4 and RE6 are same.

The fourth transmission gate TX4 has first and second control terminals and first and second data terminals that can be coupled with the gating circuit 112, the second inverter INV2, the sixth inverter INV6, and the fifth inverter INV5, respectively. The first and second control terminals of the fourth transmission gate TX4 can be configured to receive the first and second clock signals CLK1 and CLK2 from the gating circuit 112 and the second inverter INV2, respectively. In an embodiment, the first and second control terminals of the fourth transmission gate TX4 correspond to negative and positive control terminals, respectively. The first data terminal of the fourth transmission gate TX4 can be configured to receive the sixth reference data RE6 from the sixth inverter INV6. Further, the second data terminal of the fourth transmission gate TX4 can be configured to output and provide the sixth reference data RE6 to the fifth inverter INV5 when the first clock signal CLK1 is deactivated. Thus, the fifth inverter INV5 can output the first control data CD1 based on the fourth and sixth reference data RE4 and RE6 when the first clock signal CLK1 is activated and deactivated, respectively.

The third latch 308 can be coupled with the second latch 306 (i.e., the second data terminal of the third transmission gate TX3), the gating circuit 112, the second inverter INV2, the first control circuitry 108 (i.e., the processing circuit 202), and the first inverter INV1. The third latch 308 can be configured to receive the fourth reference data RE4 and the first and second clock signals CLK1 and CLK2 from the second latch 306, the gating circuit 112, and the second inverter INV2, respectively. Further, the third latch 308 can be configured to receive the first and second control signals CS1 and CS2 from the first control circuitry 108 (i.e., the processing circuit 202) and the first inverter INV1, respectively. Based on the fourth reference data RE4, the first and second clock signals CLK1 and CLK2, and the first and second control signals CS1 and CS2, the third latch 308 can be further configured to output the first reference data RE1. The third latch 308 can be further coupled with the selection circuit 302 (i.e., the second input terminal of the first multiplexer 310). Further, the third latch 308 can be configured to provide the first reference data RE1 to the selection circuit 302 (i.e., the second input terminal of the first multiplexer 310). The third latch 308 can correspond to a data retention latch of the first scan flip-flop 118a. The third latch 308 can include seventh and eighth inverters INV7 and INV8 and fifth through seventh transmission gates TX5-TX7.

The seventh inverter INV7 can be coupled with the selection circuit 302 (i.e., the second input terminal of the first multiplexer 310). The seventh inverter INV7 can be configured to output and provide the first reference data RE1 to the selection circuit 302 (i.e., the second input terminal of the first multiplexer 310).

The fifth transmission gate TX5 has first and second control terminals and first and second data terminals that can be coupled with the first control circuitry 108 (i.e., the processing circuit 202), the first inverter INV1, the second data terminal of the third transmission gate TX3, and the seventh inverter INV7, respectively. The first and second control terminals of the fifth transmission gate TX5 can be configured to receive the first and second control signals CS1 and CS2 from the first control circuitry 108 (i.e., the processing circuit 202) and the first inverter INV1, respectively. In an embodiment, the first and second control terminals of the fifth transmission gate TX5 correspond to negative and positive control terminals, respectively. The first data terminal of the fifth transmission gate TX5 can be configured to receive the fourth reference data RE4 from the second data terminal of the third transmission gate TX3. Further, the second data terminal of the fifth transmission gate TX5 can be configured to output and provide the fourth reference data RE4 to the seventh inverter INV7 when the first control signal CS1 is deactivated.

The eighth inverter INV8 can be coupled with the seventh inverter INV7. The eighth inverter INV8 can be configured to receive the first reference data RE1 from the seventh inverter INV7, and output seventh reference data RE7. The seventh reference data RE7 can be outputted such that a logic state of the seventh reference data RE7 is same as the logic state of the fourth reference data RE4.

The sixth transmission gate TX6 has first and second control terminals and first and second data terminals that can be coupled with the first inverter INV1, the first control circuitry 108 (i.e., the processing circuit 202), the eighth inverter INV8, and the seventh inverter INV7, respectively. The first and second control terminals of the sixth transmission gate TX6 can be configured to receive the second and first control signals CS2 and CS1 from the first inverter INV1 and the first control circuitry 108 (i.e., the processing circuit 202), respectively. In an embodiment, the first and second control terminals of the sixth transmission gate TX6 correspond to negative and positive control terminals, respectively. The first data terminal of the sixth transmission gate TX6 can be configured to receive the seventh reference data RE7 from the eighth inverter INV8. Further, the second data terminal of the sixth transmission gate TX6 can be configured to output and provide the seventh reference data RE7 to the seventh inverter INV7 when the first control signal CS1 is activated.

The seventh transmission gate TX7 has first and second control terminals and first and second data terminals that can be coupled with the gating circuit 112, the second inverter INV2, the eighth inverter INV8, and the seventh inverter INV7, respectively. The first and second control terminals of the seventh transmission gate TX7 can be configured to receive the first and second clock signals CLK1 and CLK2 from the gating circuit 112 and the second inverter INV2, respectively. In an embodiment, the first and second control terminals of the seventh transmission gate TX7 correspond to negative and positive control terminals, respectively. The first data terminal of the seventh transmission gate TX7 can be configured to receive the seventh reference data RE7 from the eighth inverter INV8. Further, the second data terminal of the seventh transmission gate TX7 can be configured to output and provide the seventh reference data RE7 to the seventh inverter INV7 when the first clock signal CLK1 is deactivated. Thus, the seventh inverter INV7 can output the first reference data RE1 based on the fourth reference data RE4 when the first control signal CS1 is deactivated. Further, the seventh inverter INV7 can output the first reference data RE1 based on the seventh reference data RE7 when at least one of the first clock signal CLK1 is deactivated and the first control signal CS1 is activated.

Although FIG. 3A illustrates that the third latch 308 includes the seventh transmission gate TX7 for outputting the first reference data RE1, the scope of the present disclosure is not limited to it. In an alternate embodiment of the present disclosure, the third latch 308 can output the first reference data RE1 sans the seventh transmission gate TX7. In such a scenario, the seventh inverter INV7 can output the first reference data RE1 based on the fourth reference data RE4 and the seventh reference data RE7 when the first control signal CS1 is deactivated and activated, respectively.

During the functional mode associated with the scan chain 102, the third and fourth control signals CS3 and CS4 are deactivated. As a result, the selection circuit 302 can output the first functional data FD1 as the second reference data RE2. The first latch 304 can receive the first functional data FD1 outputted as the second reference data RE2, and output the fourth reference data RE4. The fourth reference data RE4 is an inverted version of the second reference data RE2. The fourth reference data RE4 can be outputted based on the second and fifth reference data RE2 and RE5 when the first clock signal CLK1 is deactivated and activated, respectively. The second latch 306 can similarly receive the fourth reference data RE4 and output the first control data CD1. The first control data CD1 is an inverted version of the fourth reference data RE4. Thus, the first scan flip-flop 118a can output the first functional data FD1 as the first control data CD1 during the functional mode. Further, during the functional mode, the first and second control signals CS1 and CS2 are deactivated and activated, respectively. Hence, the third latch 308 receives the fourth reference data RE4, and outputs the first reference data RE1. The first reference data RE1 is an inverted version of the fourth reference data RE4. The third latch 308 can thus store functional data (i.e., the first functional data FD1) therein.

When the structural testing of the SoC 100 is initiated, the scan chain 102 operates in the structural testing mode. During the shift phase of the structural testing mode, the third control signal CS3 is deactivated and the fourth control signal CS4 is activated. Hence, the selection circuit 302 can select and output the scan data SD as the second reference data RE2. The first and second latches 304 and 306 can thus output the scan data SD as the first control data CD1 in a similar manner as described above. Further, during the shift phase of the structural testing mode, the first and second control signals CS1 and CS2 are activated and deactivated, respectively. Hence, the fifth transmission gate TX5 is deactivated. As a result, the third latch 308 retains the last stored functional data (i.e., the first functional data FD1) therein.

During the capture phase of the structural testing mode, the third and fourth control signals CS3 and CS4 are deactivated, and the first functional data FD1 can be outputted as the second reference data RE2. The functional data outputted by the first scan flip-flop 118a during the capture phase of the structural testing mode can correspond to a response of the SoC 100 to the scan pattern (i.e., the scan data SD). The capture phase is followed by another shift phase where the captured response is shifted through the first scan flip-flop 118a.

When the structural testing of the SoC 100 is completed and prior to the activation of the functional mode, the third and fourth control signals CS3 and CS4 are activated. Thus, the selection circuit 302 can select and output the first reference data RE1 as the second reference data RE2. The first and second latches 304 and 306 can then output the first reference data RE1 as the first control data CD1 in a similar manner as described above. Thus, the stored functional data is retained during the structural testing of the SoC 100. The first scan flip-flop 118a can then operate in the functional mode until the structural testing of the SoC 100 is subsequently initiated.

It will be apparent to a person skilled in the art that the second and third scan flip-flops 118b and 118c operate in a similar manner as described above. In the second scan flip-flop 118b, the selection circuit 302 (i.e., the first multiplexer 310) can select and output the first control data CD1 as the second reference data RE2 during the shift phase of the structural testing mode, as opposed to the scan data SD being outputted by the selection circuit 302 of the first scan flip-flop 118a. Similarly, in the third scan flip-flop 118c, the selection circuit 302 (i.e., the first multiplexer 310) can select and output the second control data CD2 as the second reference data RE2 during the shift phase of the structural testing mode.

Figure 3B:
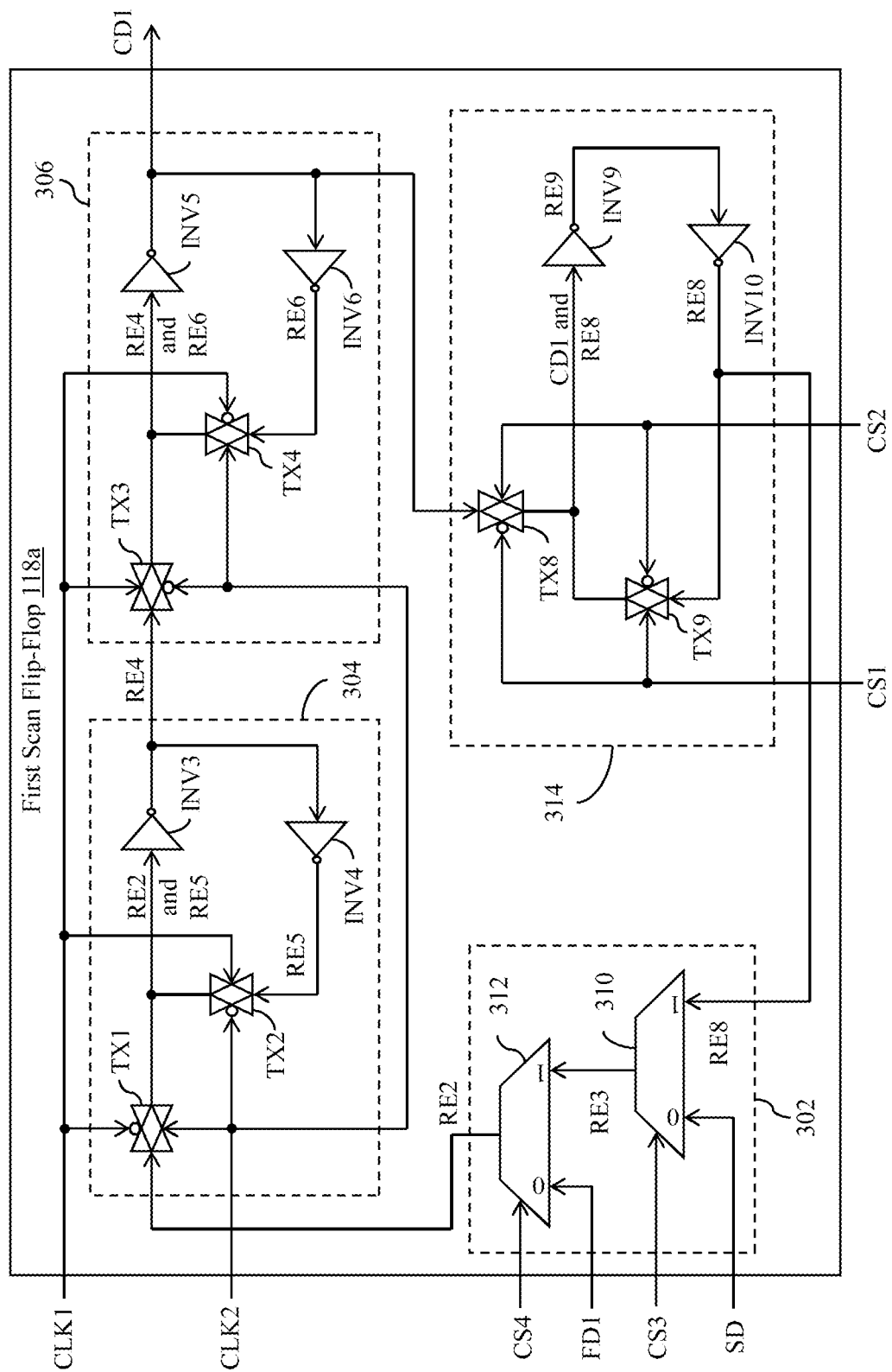
FIG. 3B illustrates a schematic circuit diagram of the first scan flip-flop in accordance with another embodiment of the present disclosure.

FIG. 3B illustrates a schematic circuit diagram of the first scan flip-flop 118a in accordance with another embodiment of the present disclosure. The first scan flip-flop 118a can include the selection circuit 302, the first and second latches 304 and 306, and a fourth latch 314. The structure and functionality of the selection circuit 302, the first latch 304, and the second latch 306 remain same as described in FIG. 3A.

The fourth latch 314 can be coupled with the second latch 306 (i.e., the fifth inverter INV5), the first control circuitry 108 (i.e., the processing circuit 202), and the first inverter INV1. The fourth latch 314 can be configured to receive the first control data CD1 and the first and second control signals CS1 and CS2 from the second latch 306 (i.e., the fifth inverter INV5), the first control circuitry 108 (i.e., the processing circuit 202), and the first inverter INV1, respectively. Based on the first control data CD1 and the first and second control signals CS1 and CS2, the fourth latch 314 can be further configured to output eighth reference data RE8. The fourth latch 314 can be further coupled with the selection circuit 302 (i.e., the second input terminal of the first multiplexer 310). The fourth latch 314 can be further configured to provide the eighth reference data RE8 to the selection circuit 302 (i.e., the second input terminal of the first multiplexer 310). The eighth reference data RE8 can thus correspond to functional data that is stored in the fourth latch 314 prior to the activation of the structural testing mode associated with the scan chain 102. The fourth latch 314 can thus correspond to a data retention latch of the first scan flip-flop 118a. The fourth latch 314 can include ninth and tenth inverters INV9 and INV10 and eighth through ninth transmission gates TX8 and TX9.

The ninth inverter INV9 can be configured to output ninth reference data RE9. The tenth inverter INV10 can be coupled with the ninth inverter INV9 and the selection circuit 302 (i.e., the second input terminal of the first multiplexer 310). The tenth inverter INV10 can be configured to receive the ninth reference data RE9 from the ninth inverter INV9, and output the eighth reference data RE8. Further, the tenth inverter INV10 can output the eighth reference data RE8 such that logic states of the eighth reference data RE8 and the first control data CD1 are same. The tenth inverter INV10 can be further configured to provide the eighth reference data RE8 to the selection circuit 302 (i.e., the second input terminal of the first multiplexer 310).

The eighth transmission gate TX8 has first and second control terminals and first and second data terminals that can be coupled with the first control circuitry 108 (i.e., the processing circuit 202), the first inverter INV1, the second latch 306 (i.e., the fifth inverter INV5), and the ninth inverter INV9, respectively. The first and second control terminals of the eighth transmission gate TX8 can be configured to receive the first and second control signals CS1 and CS2 from the first control circuitry 108 (i.e., the processing circuit 202) and the first inverter INV1, respectively. In an embodiment, the first and second control terminals of the eighth transmission gate TX8 correspond to negative and positive control terminals, respectively. The first data terminal of the eighth transmission gate TX8 can be configured to receive the first control data CD1 from the second latch 306 (i.e., the fifth inverter INV5). Further, the second data terminal of the eighth transmission gate TX8 can be configured to output and provide the first control data CD1 to the ninth inverter INV9 when the first control signal CS1 is deactivated.

The ninth transmission gate TX9 has first and second control terminals and first and second data terminals that can be coupled with the first inverter INV1, the first control circuitry 108 (i.e., the processing circuit 202), the tenth inverter INV10, and the ninth inverter INV9, respectively. The first and second control terminals of the ninth transmission gate TX9 can be configured to receive the second and first control signals CS2 and CS1 from the first inverter INV1 and the first control circuitry 108 (i.e., the processing circuit 202), respectively. In an embodiment, the first and second control terminals of the ninth transmission gate TX9 correspond to negative and positive control terminals, respectively. The first data terminal of the ninth transmission gate TX9 can be configured to receive the eighth reference data RE8 from the tenth inverter INV10. Further, the second data terminal of the ninth transmission gate TX9 can be configured to output and provide the eighth reference data RE8 to the ninth inverter INV9 when the first control signal CS1 is activated. Thus, the ninth inverter INV9 can output the ninth reference data RE9 based on the first control data CD1 and the eighth reference data RE8 when the first control signal CS1 is deactivated and activated, respectively.

It will be apparent to a person skilled in the art that the first scan flip-flop 118a of FIG. 3B can operate in a manner similar to that of the first scan flip-flop 118a of FIG. 3A. Further, the second and third scan flip-flops 118b and 118c that are structurally similar to the first scan flip-flop 118a of FIG. 3B can operate in a manner similar to that of the second and third scan flip-flops 118b and 118c as described above in FIG. 3A, respectively.

Thus, in a scan flip-flop of the present disclosure (i.e., the first through third scan flip-flops 118a-118c), the first multiplexer 310 (i.e., a multiplexer that facilitates the data retention during the structural testing of the SoC 100) is coupled between a data retention latch (i.e., the third and fourth latches 308 and 314) and the second multiplexer 312. Hence, the first multiplexer 310 is not included in a functional data propagation path associated with the scan flip-flop. As a result, when the SoC 100 operates in the functional mode, a delay is not introduced in the propagation of functional data (i.e., the first through third functional data FD1-FD3) through the scan flip-flop of the present disclosure. Hence, a time required for the functional data to propagate through the scan flip-flop of the present disclosure is significantly less than that required for propagating through a conventional scan flip-flop that includes a multiplexer in the functional data propagation path. Thus, a performance (i.e., a throughput) of the SoC 100 of the present disclosure is significantly greater than that of an SoC that includes the conventional scan flip-flop.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A scan flip-flop, comprising:
a selection circuit configured to output, based on a set of control signals, one of functional data, first reference data, scan data, and first control data as second reference data;
a first latch that is coupled with the selection circuit, and configured to receive the second reference data and a first clock signal, and output third reference data;
a second latch that is coupled with the first latch, and configured to receive the third reference data and the first clock signal, and output second control data; and
a third latch that is coupled with the second latch and the selection circuit, and configured to receive one of the third reference data and the second control data, and output and provide the first reference data to the selection circuit.

2. The scan flip-flop of claim 1, wherein (i) the selection circuit outputs the functional data as the second reference data during a functional mode associated with a scan chain that includes the scan flip-flop, and a capture phase of a structural testing mode associated with the scan chain, (ii) the selection circuit outputs one of the scan data and the first control data as the second reference data during a shift phase of the structural testing mode, and (iii) the selection circuit outputs the first reference data as the second reference data after the structural testing mode is deactivated and prior to an activation of the functional mode, thereby facilitating data retention during the structural testing mode.

3. The scan flip-flop of claim 1, wherein the selection circuit comprises:
a first multiplexer that is coupled with the third latch, and configured to receive the first reference data, a first control signal of the set of control signals, and one of the scan data and the first control data, and select and output, based on the first control signal, one of the scan data, the first control data, and the first reference data as fourth reference data, wherein when the first control signal is deactivated, the first multiplexer selects and outputs one of the scan data and the first control data as the fourth reference data, and when the first control signal is activated, the first multiplexer selects and outputs the first reference data as the fourth reference data; and
a second multiplexer that is coupled with the first multiplexer, and configured to receive the fourth reference data, the functional data, and a second control signal of the set of control signals, and select and output, based on the second control signal, one of the functional data and the fourth reference data as the second reference data, wherein when the second control signal is deactivated, the second multiplexer selects and outputs the functional data as the second reference data, and when the second control signal is activated, the second multiplexer selects and outputs the fourth reference data as the second reference data.

4. The scan flip-flop of claim 3, wherein (i) the first control signal is deactivated during functional and structural testing modes associated with a scan chain that includes the scan flip-flop, (ii) the first control signal is activated after the structural testing mode is deactivated and prior to an activation of the functional mode, (iii) the second control signal is deactivated during the functional mode and a capture phase of the structural testing mode, (iv) the second control signal is activated during a shift phase of the structural testing mode, and (v) the second control signal is further activated after the structural testing mode is deactivated and prior to the activation of the functional mode.

5. The scan flip-flop of claim 1, wherein the first latch comprises:
a first inverter configured to output the third reference data;
a first transmission gate that has (i) first and second control terminals configured to receive the first clock signal and a second clock signal that is an inverted version of the first clock signal, respectively, (ii) a first data terminal, coupled with the selection circuit, and configured to receive the second reference data, and (iii) a second data terminal, coupled with the first inverter, and configured to output and provide the second reference data to the first inverter when the first clock signal is deactivated;
a second inverter that is coupled with the first inverter, and configured to receive the third reference data and output fifth reference data, wherein logic states of the fifth and second reference data are same; and
a second transmission gate that has (i) first and second control terminals configured to receive the second and first clock signals, respectively, (ii) a first data terminal, coupled with the second inverter, and configured to receive the fifth reference data, and (iii) a second data terminal, coupled with the first inverter, and configured to output and provide the fifth reference data to the first inverter when the first clock signal is activated, wherein the first inverter outputs the third reference data based on the second and fifth reference data when the first clock signal is deactivated and activated, respectively.

6. The scan flip-flop of claim 1, wherein the second latch comprises:
a third inverter configured to output the second control data;
a third transmission gate that has (i) a first control terminal configured to receive a second clock signal that is an inverted version of the first clock signal, (ii) a second control terminal configured to receive the first clock signal, (iii) a first data terminal, coupled with the first latch, and configured to receive the third reference data, and (iv) a second data terminal, coupled with the third inverter, and configured to output and provide the third reference data to the third inverter when the first clock signal is activated;

a fourth inverter that is coupled with the third inverter, and configured to receive the second control data and output sixth reference data, wherein logic states of the third and sixth reference data are same; and a fourth transmission gate that has (i) first and second control terminals configured to receive the first and second clock signals, respectively, (ii) a first data terminal, coupled with the fourth inverter, and configured to receive the sixth reference data, and (iii) a second data terminal, coupled with the third inverter, and configured to output and provide the sixth reference data to the third inverter when the first clock signal is deactivated, wherein the third inverter outputs the second control data based on the third reference data and the sixth reference data when the first clock signal is activated and deactivated, respectively.

7. The scan flip-flop of claim 6, wherein the third latch comprises:

a fifth inverter that is coupled with the selection circuit, and configured to output and provide the first reference data to the selection circuit;

a fifth transmission gate that has (i) first and second control terminals configured to receive a third control signal and a fourth control signal that is an inverted version of the third control signal, respectively, (ii) a first data terminal, coupled with the second data terminal of the third transmission gate, and configured to receive the third reference data, and (iii) a second data terminal, coupled with the fifth inverter, and configured to output and provide the third reference data to the fifth inverter when the third control signal is deactivated, wherein the third control signal is deactivated and activated during functional and structural testing modes, respectively, that are associated with a scan chain that includes the scan flip-flop;

a sixth inverter that is coupled with the fifth inverter, and configured to receive the first reference data and output seventh reference data, wherein a logic state of the seventh reference data is same as the logic state of the third reference data; and a sixth transmission gate that has (i) first and second control terminals configured to receive the fourth and third control signals, respectively, (ii) a first data terminal, coupled with the sixth inverter, and configured to receive the seventh reference data, and (iii) a second data terminal, coupled with the fifth inverter, and configured to output and provide the seventh reference data to the fifth inverter when the third control signal is activated.

8. The scan flip-flop of claim 7, wherein the third latch further comprises a seventh transmission gate that has (i) first and second control terminals configured to receive the first and second clock signals, respectively, (ii) a first data terminal, coupled with the sixth inverter, and configured to receive the seventh reference data, and (iii) a second data terminal, coupled with the fifth inverter, and configured to output and provide the seventh reference data to the fifth inverter when the first clock signal is deactivated, wherein the fifth inverter outputs the first reference data based on the third reference data when the third control signal is deactivated, and wherein the fifth inverter outputs the first reference data based on the seventh reference data when at least one of the first clock signal is deactivated and the third control signal is activated.

9. The scan flip-flop of claim 1, wherein the third latch comprises:

a seventh inverter configured to output eighth reference data;

an eighth transmission gate that has (i) first and second control terminals configured to receive a third control signal and a fourth control signal that is an inverted version of the third control signal, respectively, (ii) a first data terminal, coupled with the second latch, and configured to receive the second control data, and (iii) a second data terminal, coupled with the seventh inverter, and configured to output and provide the second control data to the seventh inverter when the third control signal is deactivated, wherein the third control signal is deactivated and activated during functional and structural testing modes, respectively, that are associated with a scan chain that includes the scan flip-flop;

an eighth inverter that is coupled with the seventh inverter and the selection circuit, and configured to receive the eighth reference data and output and provide the first reference data to the selection circuit, wherein logic states of the first reference data and the second control data are same; and a ninth transmission gate that has (i) first and second control terminals configured to receive the fourth and third control signals, respectively, (ii) a first data terminal, coupled with the eighth inverter, and configured to receive the first reference data, and (iii) a second data terminal, coupled with the seventh inverter, and configured to output and provide the first reference data to the seventh inverter when the third control signal is activated, wherein the seventh inverter outputs the eighth reference data based on the second control data and the first reference data when the third control signal is deactivated and activated, respectively.

10. A system-on-chip (SoC), comprising:

control circuitry configured to output a plurality of control signals; and a scan chain comprising a plurality of scan flip-flops, wherein the plurality of scan flip-flops are coupled in series with each other, and wherein each scan flip-flop of the plurality of scan flip-flops comprises:

a selection circuit that is coupled with the control circuitry, and configured to output, based on a set of control signals of the plurality of control signals, one of functional data, first reference data, scan data, and first control data as second reference data;

a first latch that is coupled with the selection circuit, and configured to receive the second reference data and a first clock signal, and output third reference data;

a second latch that is coupled with the first latch, and configured to receive the third reference data and the first clock signal, and output second control data; and a third latch that is coupled with the second latch and the selection circuit, and configured to receive one of the third reference data and the second control data, and output and provide the first reference data to the selection circuit.

11. The SoC of claim 10, wherein (i) the selection circuit outputs the functional data as the second reference data during a functional mode associated with the scan chain and a capture phase of a structural testing mode associated with the scan chain, (ii) the selection circuit outputs one of the scan data and the first control data as the second reference data during a shift phase of the structural testing mode, and (iii) the selection circuit outputs the first reference data as the second reference data after the structural testing mode is deactivated and prior to an activation of the functional mode, thereby facilitating data retention during the structural testing mode.

12. The SoC of claim 10, wherein the control circuitry comprises:
   a processing circuit that is configured to output first and second control signals and a second clock signal, wherein the first control signal is deactivated during functional and structural testing modes associated with the scan chain, and activated after the structural testing mode is deactivated and prior to an activation of the functional mode;
   a flip-flop that is coupled with the processing circuit, and configured to receive the first control signal and the second clock signal, and output a third control signal;
   a first logic gate that is coupled with the processing circuit and the flip-flop, and configured to receive the first and third control signals, respectively, and output a fourth control signal; and
   a second logic gate that is coupled with the processing circuit and the first logic gate, and configured to receive the second and fourth control signals, respectively, and output a fifth control signal, wherein the set of control signals includes the first and fifth control signals, wherein the fifth control signal is deactivated during the functional mode and a capture phase of the structural testing mode, wherein the fifth control signal is activated during a shift phase of the structural testing mode, and wherein the fifth control signal is further activated after the structural testing mode is deactivated and prior to the activation of the functional mode.

13. The SoC of claim 12, wherein the selection circuit comprises:
   a first multiplexer that is coupled with the third latch and the processing circuit, and configured to receive the first reference data and the first control signal, respectively, wherein the first multiplexer is further configured to receive one of the scan data and the first control data, and select and output, based on the first control signal, one of the scan data, the first control data, and the first reference data as fourth reference data, and wherein when the first control signal is deactivated, the first multiplexer selects and outputs one of the scan data and the first control data as the fourth reference data, and when the first control signal is activated, the first multiplexer selects and outputs the first reference data as the fourth reference data; and
   a second multiplexer that is coupled with the first multiplexer and the second logic gate, and configured to receive the fourth reference data and the fifth control signal, respectively, wherein the second multiplexer is further configured to receive the functional data, and select and output, based on the fifth control signal, one of the functional data and the fourth reference data as the second reference data, and wherein when the fifth control signal is deactivated, the second multiplexer selects and outputs the functional data as the second reference data, and when the fifth control signal is activated, the second multiplexer selects and outputs the fourth reference data as the second reference data.

14. The SoC of claim 12, wherein the control circuitry further comprises a clock gate that is coupled with the processing circuit and the second logic gate, and configured to receive the second clock signal and the fifth control signal, respectively, and output a third clock signal.

15. The SoC of claim 14, further comprising a gating circuit that is coupled with the clock gate, the processing circuit, and the second logic gate, and configured to receive the third clock signal, the first control signal, and the fifth control signal, respectively, and output the first clock signal.

16. The SoC of claim 10, wherein the first latch comprises:
   a first inverter configured to output the third reference data;
   a first transmission gate that has (i) first and second control terminals configured to receive the first clock signal and a fourth clock signal that is an inverted version of the first clock signal, respectively, (ii) a first data terminal, coupled with the selection circuit, and configured to receive the second reference data, and (iii) a second data terminal, coupled with the first inverter, and configured to output and provide the second reference data to the first inverter when the first clock signal is deactivated;
   a second inverter that is coupled with the first inverter, and configured to receive the third reference data and output fifth reference data, wherein logic states of the fifth and second reference data are same; and
   a second transmission gate that has (i) first and second control terminals configured to receive the fourth and first clock signals, respectively, (ii) a first data terminal, coupled with the second inverter, and configured to receive the fifth reference data, and (iii) a second data terminal, coupled with the first inverter, and configured to output and provide the fifth reference data to the first inverter when the first clock signal is activated, wherein the first inverter outputs the third reference data based on the second and fifth reference data when the first clock signal is deactivated and activated, respectively.

17. The SoC of claim 10, wherein the second latch comprises:
   a third inverter configured to output the second control data;
   a third transmission gate that has (i) a first control terminal configured to receive a fourth clock signal that is an inverted version of the first clock signal, (ii) a second control terminal configured to receive the first clock signal, (iii) a first data terminal, coupled with the first latch, and configured to receive the third reference data, and (iv) a second data terminal, coupled with the third inverter, and configured to output and provide the third reference data to the third inverter when the first clock signal is activated;
   a fourth inverter that is coupled with the third inverter, and configured to receive the second control data and output sixth reference data, wherein logic states of the third and sixth reference data are same; and
   a fourth transmission gate that has (i) first and second control terminals configured to receive the first and fourth clock signals, respectively, (ii) a first data terminal, coupled with the fourth inverter, and configured to receive the sixth reference data, and (iii) a second data terminal, coupled with the third inverter, and configured to output and provide the sixth reference data to the third inverter when the first clock signal is deactivated, wherein the third inverter outputs the second control data based on the third reference data and the sixth reference data when the first clock signal is activated and deactivated, respectively.

18. The SoC of claim 17, wherein the third latch comprises:
   a fifth inverter that is coupled with the selection circuit, and configured to output and provide the first reference data to the selection circuit;

a fifth transmission gate that has (i) first and second control terminals configured to receive a sixth control signal of the plurality of control signals, and a seventh control signal that is an inverted version of the sixth control signal, respectively, (ii) a first data terminal, coupled with the second data terminal of the third transmission gate, and configured to receive the third reference data, and (iii) a second data terminal, coupled with the fifth inverter, and configured to output and provide the third reference data to the fifth inverter when the sixth control signal is deactivated, wherein the sixth control signal is deactivated and activated during functional and structural testing modes, respectively, that are associated with the scan chain;

a sixth inverter that is coupled with the fifth inverter, and configured to receive the first reference data and output seventh reference data, wherein a logic state of the seventh reference data is same as the logic state of the third reference data; and a sixth transmission gate that has (i) first and second control terminals configured to receive the seventh and sixth control signals, respectively, (ii) a first data terminal, coupled with the sixth inverter, and configured to receive the seventh reference data, and (iii) a second data terminal, coupled with the fifth inverter, and configured to output and provide the seventh reference data to the fifth inverter when the sixth control signal is activated.

19. The SoC of claim 18, wherein the third latch further comprises a seventh transmission gate that has (i) first and second control terminals configured to receive the first and fourth clock signals, respectively, (ii) a first data terminal, coupled with the sixth inverter, and configured to receive the seventh reference data, and (iii) a second data terminal, coupled with the fifth inverter, and configured to output and provide the seventh reference data to the fifth inverter when the first clock signal is deactivated, wherein the fifth inverter outputs the first reference data based on the third reference data when the sixth control signal is deactivated, and wherein the fifth inverter outputs the first reference data based on the seventh reference data when at least one of the first clock signal is deactivated and the sixth control signal is activated.

20. The SoC of claim 10, wherein the third latch comprises:

a seventh inverter configured to output eighth reference data;

an eighth transmission gate that has (i) first and second control terminals configured to receive a sixth control signal of the plurality of control signals, and a seventh control signal that is an inverted version of the sixth control signal, respectively, (ii) a first data terminal, coupled with the second latch, and configured to receive the second control data, and (iii) a second data terminal, coupled with the seventh inverter, and configured to output and provide the second control data to the seventh inverter when the sixth control signal is deactivated, wherein the sixth control signal is deactivated and activated during functional and structural testing modes, respectively, that are associated with the scan chain;

an eighth inverter that is coupled with the seventh inverter and the selection circuit, and configured to receive the eighth reference data and output and provide the first reference data to the selection circuit, wherein logic states of the first reference data and the second control data are same; and a ninth transmission gate that has (i) first and second control terminals configured to receive the seventh and sixth control signals, respectively, (ii) a first data terminal, coupled with the eighth inverter, and configured to receive the first reference data, and (iii) a second data terminal, coupled with the seventh inverter, and configured to output and provide the first reference data to the seventh inverter when the sixth control signal is activated, wherein the seventh inverter outputs the eighth reference data based on the second control data and the first reference data when the sixth control signal is deactivated and activated, respectively.

\* \* \* \* \*